(12) United States Patent
Takata

(10) Patent No.: US 8,222,973 B2
(45) Date of Patent: Jul. 17, 2012

(54) ELASTIC WAVE RESONATOR, LADDER FILTER AND DUPLEXER

(75) Inventor: Toshiaki Takata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/306,012

(22) Filed: Nov. 29, 2011

(65) Prior Publication Data

US 2012/0068787 A1 Mar. 22, 2012

Related U.S. Application Data

(63) Continuation of application No. PCT/JP2010/058199, filed on May 14, 2010.

(30) Foreign Application Priority Data

Jun. 4, 2009 (JP) .................................. 2009-135264

(51) Int. Cl.
- *H03H 9/64* (2006.01)
- *H03H 9/72* (2006.01)
- *H03H 9/25* (2006.01)

(52) U.S. Cl. ...................... 333/133; 333/196; 310/313 C

(58) Field of Classification Search .................. 333/133, 333/193–196; 310/313 B, 313 C, 313 D
See application file for complete search history.

(56) References Cited

U.S. PATENT DOCUMENTS

| | | | |
|---|---|---|---|
| 3,760,204 A * | 9/1973 | Yester, Jr. .................. | 310/313 B |
| 6,346,761 B1 | 2/2002 | Isobe et al. | |
| 7,453,334 B1 * | 11/2008 | Abbott et al. .................. | 333/195 |
| 2003/0117240 A1 * | 6/2003 | Inoue et al. .................... | 333/195 |
| 2007/0008052 A1 | 1/2007 | Wada et al. | |
| 2008/0129418 A1 * | 6/2008 | Miura et al. .................. | 333/195 |
| 2008/0309192 A1 | 12/2008 | Nakao et al. | |
| 2009/0206954 A1 * | 8/2009 | Hashimoto et al. ........... | 333/195 |
| 2009/0267707 A1 * | 10/2009 | Miura et al. .................. | 333/193 |

FOREIGN PATENT DOCUMENTS

| | | |
|---|---|---|
| EP | 1962424 A1 | 8/2008 |
| JP | 11-298286 | * 10/1999 |
| JP | 2000-286663 A | 10/2000 |
| JP | 2006-121634 A | 5/2006 |
| JP | 2007-019710 A | 1/2007 |
| JP | 2008-078885 A | 4/2008 |
| WO | 2007/108269 A1 | 9/2007 |
| WO | 2008/078573 A1 | 7/2008 |

OTHER PUBLICATIONS

Official Communication issued in International Patent Application No. PCT/JP2010/058199, mailed on Aug. 3, 2010.

* cited by examiner

*Primary Examiner* — Barbara Summons

(74) *Attorney, Agent, or Firm* — Keating & Bennett, LLP

(57) ABSTRACT

An acoustic wave resonator that is excellent in terms of return loss characteristics at the resonant and anti-resonant frequencies and that is capable of effectively reducing loss includes an IDT electrode in which a plurality of first electrode fingers and a plurality of second dummy electrode fingers are connected to a first common electrode, a plurality of second electrode fingers and a plurality of first dummy electrode fingers are connected to a second common electrode. Apodization weighting is applied in the acoustic wave propagation direction. The metallization ratio of a non-crossing region is relatively high compared with the metallization ratio of a crossing region in the acoustic wave propagation direction.

10 Claims, 5 Drawing Sheets

ELASTIC WAVE RESONATOR, LADDER FILTER AND DUPLEXER

BACKGROUND OF THE INVENTION

1. Field of the Invention

The present invention relates to elastic wave resonators used in resonators, band-pass filters and the like and to ladder filters constructed using elastic wave resonators. More specifically the present invention relates to an elastic wave resonator in which an IDT electrode is apodization weighted, and also relates to a ladder filter and a duplexer.

2. Description of the Related Art

To date, elastic wave devices have been widely used as resonators and band-pass filters.

For example, an elastic wave resonator having the electrode structure illustrated in FIG. 9 is disclosed in PCT International Publication No. WO 2007/108269. In an elastic wave resonator 1001 illustrated in FIG. 9, a plurality of first electrode fingers 1002 and a plurality of second electrode fingers 1003 are arranged so as to be interposed between one another. One end of each of the plurality of first electrode fingers 1002 is connected to a first common electrode 1004 and the other end thereof extends toward a second common electrode 1005 side. One end of each of the plurality of second electrode fingers 1003 is connected to the second common electrode 1005 and the other end thereof extends toward the first common electrode 1004 side. Furthermore, an end of each of a plurality of first dummy electrode fingers 1006 is connected to the second common electrode 1005. The other ends of the first dummy electrode fingers 1006 face the leading ends of the first electrode fingers 1002 with gaps therebetween. Similarly, an end of each of second dummy electrode fingers 1007 is connected to the first common electrode 1004. The other ends of the second dummy electrode fingers 1007 face the leading ends of the second electrode fingers 1003 with gaps therebetween.

Here, apodization weighting is applied so that the crossing width of the IDT electrode changes in the elastic wave propagation direction. In the apodization weighting, there are two maximum values of crossing width in the surface acoustic wave propagation direction of the IDT electrode 1002. Therefore, the envelopes that enclose a crossing region, that is, a region in which the first and second electrode fingers 1002 and 1003 cross one another, form the shape of two connected diamonds.

In PCT International Publication No. WO 2007/108269, it is supposed that, as a result of this kind of weighting, not only is spurious due to transverse-mode ripples reduced but also the Q value at the anti-resonant frequency and the electric power handling capability can be increased.

In the elastic wave resonator described in PCT International Publication No. WO 2007/108269, since there are large non-crossing regions in which the first and second electrode fingers 1002 and 1003 do not cross one another in the IDT electrode, the excitation intensity of elastic waves is smaller than that in a normal IDT electrode. Furthermore, in portions in which there is such a large non-crossing region, the first and second dummy electrode fingers 1006 and 1007 are long and therefore the resistive loss of the dummy electrode fingers is large. Therefore, there is a problem with this elastic wave resonator in that the Q value at the resonant frequency is unsatisfactory. Furthermore, in a ladder filter constructed using this elastic wave resonator, although the electric power handling capability has been increased, it has not been possible to sufficiently lower the insertion loss.

SUMMARY OF THE INVENTION

In view of the above-described current state of existing technologies, preferred embodiments of the present invention provide an elastic wave resonator having a high Q value. Also, preferred embodiments of the present invention provide a ladder filter including the elastic wave resonator, that is not only capable of increasing the electric power handing capability but is also capable of lowering the insertion loss. Furthermore, preferred embodiments of the present invention provide a duplexer that includes the ladder filter including the elastic wave resonator.

An elastic wave resonator according to a preferred embodiment of the present invention includes a piezoelectric substrate and an IDT electrode located on the piezoelectric substrate. The IDT electrode includes first and second common electrodes arranged so as to be separate from each other on the piezoelectric substrate; first and second common electrodes; a plurality of first electrode fingers each including one end connected to the first common electrode and each extending toward the second common electrode side; a plurality of second electrode fingers each including one end connected to the second common electrode and the other end thereof extending toward the first common electrode side; a plurality of first dummy electrode fingers each including one end connected to the first common electrode, the other end extending toward the second common electrode side, and the other end being arranged with a gap interposed between itself and a leading end of one of the plurality of first electrode fingers; one end being connected to the first common electrode, the other end being arranged on the second common electrode side, and the other end being arranged with a gap interposed between itself and a leading end of one of the plurality of second electrode fingers. A crossing region is defined by a portion in which the first and second electrode fingers overlap one another in an elastic wave propagation direction. A portion in which the dummy electrode fingers are located is a non-crossing region. The IDT electrode is apodization weighted so that a crossing width of the first electrode fingers and the second electrode fingers changes in the elastic wave propagation direction, there being at least two points of change in the apodization weighting at which the crossing width changes from increasing to decreasing. When a ratio of the area of electrode portions including the first and second electrode fingers or the first and second dummy electrode fingers to the entire area of the region in which the electrode portions are provided is termed a metallization ratio, the metallization ratio of at least a portion of the non-crossing region is relatively high compared with the metallization ratio of the crossing region. Here, "metallization ratio" refers to the ratio of the area of electrode portions including the first and second electrode fingers and the first and second dummy electrode fingers connected to the first or second common electrode within a non-crossing region to the total area of the non-crossing region.

According to a certain specific preferred embodiment of the present invention, compared with a metallization ratio of a non-crossing region located between the points of change, a metallization ratio of a non-crossing region located between an end of the IDT electrode in the elastic wave propagation direction and the point of change closest to the side of the end, and a metallization ratio of a non-crossing region located between the other end of the IDT electrode in the elastic wave propagation direction and the point of change on the side of the other end, are relatively high.

According to another specific preferred embodiment of the present invention, the metallization ratios of all non-crossing regions are relatively high compared with the metallization ratio of the crossing region.

A ladder filter according to a preferred embodiment of the present invention includes a series-arm resonator and a parallel-arm resonator, the parallel-arm resonator being composed of the elastic wave resonator according to a preferred embodiment of the present invention and the series-arm resonator being composed of the elastic wave resonator according to a preferred embodiment of the present invention.

Since in yet another preferred embodiment of the ladder filter according to the present invention, the ladder filter is excellent in terms of electric power handling capability, the ladder filter can be suitably used as the transmission-side band-pass filter of a duplexer including a reception-side band-pass filter and a transmission-side band-pass filter. Therefore, in the yet another specific preferred embodiment of the present invention, the present invention provides a ladder filter that serves as a transmission-side band-pass filter of a duplexer.

In still yet another preferred embodiment of the elastic wave resonator according to the present invention, in the non-crossing regions, the metallization ratios are high due to there being common electrode extension portions that extend from the first and second common electrodes toward the crossing region.

In still yet another specific preferred embodiment of the elastic wave resonator according to the present invention, inner edges of the first and second common electrodes extend parallel to the elastic wave propagation direction and inner edges of the common electrode extension portions extend in a direction that crosses the elastic wave propagation direction.

In still yet another preferred embodiment of the elastic wave resonator according to the present invention, the widths of the first and second dummy electrode fingers in the non-crossing regions are larger than the widths of the first and second electrode fingers in the crossing region and as a result, the metallization ratios of the non-crossing regions are high.

In yet another specific preferred embodiment of the elastic wave resonator according to the present invention, among the first and second dummy electrode fingers, the widths of dummy electrode fingers that are relatively long are larger than the widths of dummy electrode fingers that are relatively short.

An elastic wave resonator according to a preferred embodiment of the present invention may be an elastic wave resonator that utilizes surface acoustic waves or may be a boundary acoustic wave resonator that utilizes boundary acoustic waves.

In an elastic resonator according to a preferred embodiment of the present invention, the metallization ratios of non-crossing regions located in the vicinities of the two ends of the IDT electrode in the elastic wave propagation direction are relatively high compared with the metallization ratio of a non-crossing region in the center of the IDT electrode. Therefore, the resistive loss can be reduced in portions having a high metallization ratio. Accordingly, in a ladder filter including an elastic wave resonator of the present invention, loss can be reduced.

Furthermore, in various preferred embodiments of the present invention, in the case where a series-arm resonator is constructed using an elastic wave resonator in which the apodization weighting is repeatedly applied with a period of two or more in the elastic wave propagation direction, the electric power handling capability of the ladder filter can also be increased. Therefore, in the case of weighting with a period of two or more, not only can the electric power handling capability be increased, but the excitation efficiency of elastic waves can also be increased and loss can also be made sufficiently small.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
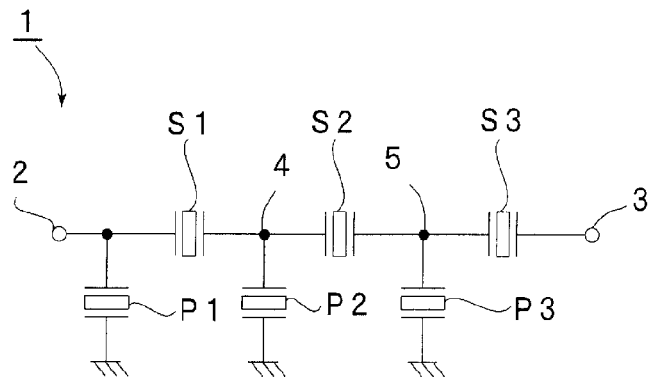
FIG. 1A is a circuit diagram of a ladder filter according to a preferred embodiment of the present invention.

Hereafter, the present invention will be made clear by describing preferred embodiments of the present invention while referring to the drawings.

Figure 1B:
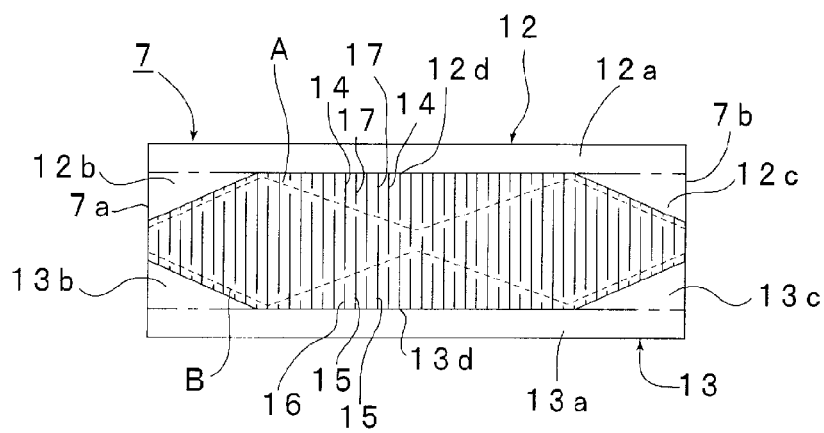
FIG. 1B is a schematic plan view illustrating an IDT electrode of a surface acoustic wave resonator used as a parallel-arm resonator of the ladder filter.

FIGS. 1A and 1B are respectively a circuit diagram of a ladder filter according to a preferred embodiment of the present invention and a schematic plan view illustrating the electrode structure of an IDT electrode of an elastic wave resonator, serving as a preferred embodiment of an elastic wave resonator of the present invention used in the ladder filter.

The ladder filter of the present preferred embodiment is preferably for use as a UMTS Band 2 transmission-side band-pass filter. The UMTS Band 2 transmission-side pass band is preferably from about 1850 MHz to about 1910 MHz, for example.

As illustrated in FIG. 1A, a ladder filter 1 includes an input terminal 2 and an output terminal 3. In a series arm that links the input terminal 2 and the output terminal 3, series-arm resonators S1 to S3 are connected in series with one another. A parallel-arm resonator P1 is arranged in a parallel arm that links a connection point between the input terminal 2 and the series-arm resonator S1, and the ground potential. A parallel-arm resonator P2 is provided in a parallel arm that links a connection point 4 between the series-arm resonators S1 and S2 and the ground potential. A parallel-arm resonator P3 is provided in a parallel arm that links a connection point 5 between the series-arm resonators S2 and S3 and the ground potential.

In this preferred embodiment, the three-stage ladder filter 1 is constructed, which includes the three series-arm resonators S1 to S3 and the three parallel-arm resonators P1 to P3. The number of stages of the ladder filter according to preferred embodiments of the present invention is arbitrary and can be changed as desired.

The series-arm resonators S1 to S3 are defined by surface acoustic wave resonators. The parallel-arm resonators P1 to P3 are also defined by surface acoustic wave resonators.

Figure 1C:
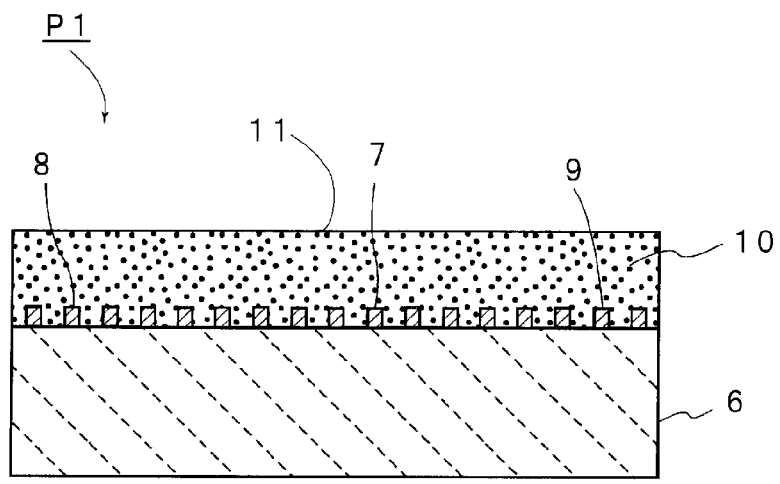
FIG. 1C is a front sectional view of the elastic wave resonator.

FIG. 1C is a schematic front sectional view of the surface acoustic wave resonator that defines the parallel-arm resonator P1. The parallel-arm resonator P1 includes, on a piezoelectric substrate 6 preferably composed of $LiNbO_3$ having a cut angle of 125°, for example, an IDT electrode 7 and reflectors 8 and 9 arranged either side of the IDT electrode 7 in the surface acoustic wave propagation direction.

The electrode portions of the IDT electrode 7 and the reflectors 8 and 9 were formed by sequentially stacking from the top, metal films AlCu/Ti/Pt/NiCr. The film thicknesses were AlCu/Ti/Pt/NiCr=about 80 nm/10 nm/30 nm/10 nm, for example. The electrode finger pitch of the IDT electrode 7 of the parallel-arm resonator P1 was about 0.96 μm and the duty ratio was about 0.5, for example. Furthermore, a $SiO_2$ film 10 having a thickness of about 500 nm, for example, was formed so as to cover the IDT electrode 7. In addition, an approximately 30 nm SiN film 11, for example, was formed on the $SiO_2$ film 10 in order to adjust the frequency.

The other parallel-arm resonators P2 and P3 were formed in the same way as the parallel-arm resonator P1.

In addition, for the series-arm resonators S1 to S3, IDT electrodes and reflectors were formed on the same piezoelectric substrate using the same electrode material and then $SiO_2$ films and SiN films were formed thereon. The pitch of the electrode fingers of the IDT electrode in the series-arm resonators S1 to S3 was approximately 0.93 μm, for example.

One of the unique features of this preferred embodiment is that apodization weighting is applied to the parallel-arm resonators P1 to P3 and the series-arm resonators S1 to S3 in the following way. Referring to FIG. 1B, the apodization weighting of the IDT electrode of the parallel-arm resonator P1 will be described in more detail.

As illustrated in FIG. 1B, the IDT electrode 7 includes first and second common electrodes 12 and 13 that extend in the surface acoustic wave propagation direction. The first common electrode 12 and the second common electrode 13 include stripe-shaped common electrode bodies 12a and 13a that extend parallel to the surface acoustic wave propagation direction. Furthermore, the first common electrode 12 includes common electrode extension portions 12b and 12c that are continuous with the common electrode body 12a. The common electrode extension portions 12b and 12c are provided in the vicinities of the two ends of the IDT electrode 7 in the surface acoustic wave propagation direction.

More specifically, the IDT electrode 7 includes a first end 7a and a second end 7b, which are ends in the surface acoustic wave propagation direction. The common electrode extension portion 12b is provided in the vicinity of the first end 7a. Similarly, the common electrode extension portion 12c is provided in the vicinity of the second end 7b. Similarly in the second common electrode 13, common electrode extension portions 13b and 13c are provided so as to be continuous with the common electrode body 13a and so as to face the common electrode extension portions 12b and 12c.

In addition, in the common electrodes 12 and 13, a plurality of metal films are again stacked. In this preferred embodiment, an Al film, a Ti film and an AlCu film are again sequentially stacked from the top and are formed such that the film thicknesses are Al/Ti/AlCu=about 1140 nm/500 nm/700 nm, for example.

The IDT electrode 7 includes a plurality of first electrode fingers 14 that each have one end electrically connected to an inner edge 12d of the first common electrode 12. Similarly, one end of each of a plurality of second electrode fingers 15 is connected to an inner edge 13d of the second common electrode 13. In addition, a plurality of first dummy electrode fingers 16 are connected to the inner edge 13d of the second common electrode 13. Leading ends of the first dummy electrode fingers 16 face leading ends of the first electrode fingers 14 with gaps therebetween. Similarly, a plurality of second dummy electrode fingers 17 are connected to an inner edge of the first common electrode 12. Leading ends of the second dummy electrode fingers 17 face leading ends of the second electrode fingers 15 with gaps therebetween.

The first and second electrode fingers 14 and 15 and the first and second dummy electrode fingers 16 and 17 extend in directions orthogonal to the surface acoustic wave propagation direction. In addition, in this preferred embodiment, the common electrode extension portions are also provided with dummy electrode fingers. The dummy electrodes are not necessarily required but it is preferable that the dummy electrodes be provided since they can function as reflectors.

A portion in which the first electrode fingers 14 and the second electrode fingers 15 overlap one another when viewed from the surface acoustic wave propagation direction is a crossing portion in which a surface acoustic wave is excited. A crossing region, in which crossing portions in which a surface acoustic wave is excited are continuous with each other, is a region enclosed by the envelopes A and B in FIG. 1B. The envelope A is an imaginary line that links the leading ends of the second electrode fingers 15 and the envelope B is an imaginary line that links the leading ends of the first electrode fingers 14. In addition, the envelopes A and B shown by dashed lines in FIG. 1B are illustrated with there being a certain gap from the leading ends of the first and second electrode fingers 14 and 15 to enable easy understanding of the drawing.

The regions that are outside the crossing region enclosed by the envelopes A and B when viewed from the surface acoustic wave propagation direction and in which there are portions in which the first electrode fingers 14, the second electrode fingers 15, the first dummy electrode fingers 16, the second dummy electrode fingers 17 and the common electrode extension portions 12b, 12c, 13b and 13c exist, are non-crossing regions.

Therefore, the common electrode body 12a of the first common electrode 12 and the common electrode body 13a of the second common electrode 13, which extend parallel to the surface acoustic wave propagation direction, are not included in the non-crossing regions. Thus, the non-crossing regions are defined on the basis of the fact that a maximum-crossingwidth portion of the crossing region, as will be described later, is superposed with the common electrode extension portions 12b, 12c, 13b and 13c, whereas the common electrode bodies 12a and 13a are not superposed with the maximum-crossing-width portion in the surface acoustic wave propagation direction, namely, the region in which an excited surface acoustic wave propagates. A portion in which a surface acoustic wave is not excited is defined without hesitation as a non-crossing region.

As illustrated in FIG. 1B, the IDT electrode 7 is apodization weighted such that the crossing width changes in the surface acoustic wave propagation direction as indicated by the envelopes A and B. More specifically, apodization weighting is applied such that there are two points of change at which the crossing width shifts from increasing to decreasing in the surface acoustic wave propagation direction that links the first end 7a and the second end 7b. In other words, there is a minimum-crossing-width portion in the center between the first end 7a and the second end 7b. A first maximum-crossing-width portion, which is one of the two points of change, is located between the minimum-crossing-width portion and the first end 7a. The weighting is applied such that the crossing width sequentially becomes smaller from the first maximum-crossing-width portion toward the first end 7a and toward the minimum-crossing-width portion. Therefore, the weighting is applied such that a diamond shape is defined by the envelopes A and B. This is termed diamond-shaped weighting.

Diamond-shaped weighting is also similarly applied between the minimum-crossing-width portion and the second end 7b. Therefore, diamond-shaped weighting is applied with a period of two to the region enclosed by the envelopes A and B.

Furthermore, the inner edges of the above-described common electrode extension portions 12b and 12c extend parallel to the envelopes A and B. Therefore, the inner edge 12d of the common electrode 12 extends in a direction that crosses the surface acoustic wave propagation direction and is not parallel with the surface acoustic wave propagation direction in portions in which the common electrode extension portions 12b and 12c are provided. In contrast, the inner edge 12d of the common electrode 12 is parallel to the surface acoustic wave propagation direction between the common electrode extension portions 12b and 12c. Here, the end of the common electrode extension portion 12b on the opposite side to the first end 7a terminates at the first maximum-crossing-width portion. In other words, the common electrode extension portion 12b is located between the first maximum-crossing-width portion and the first end 7a. Similarly, the common electrode extension portion 12c is located between a second maximum-crossing-width portion and the second end 7b. The common electrode extension portions 13b and 13c are preferably formed in the same way as the common electrode extension portions 12b and 12c.

Figure 2:
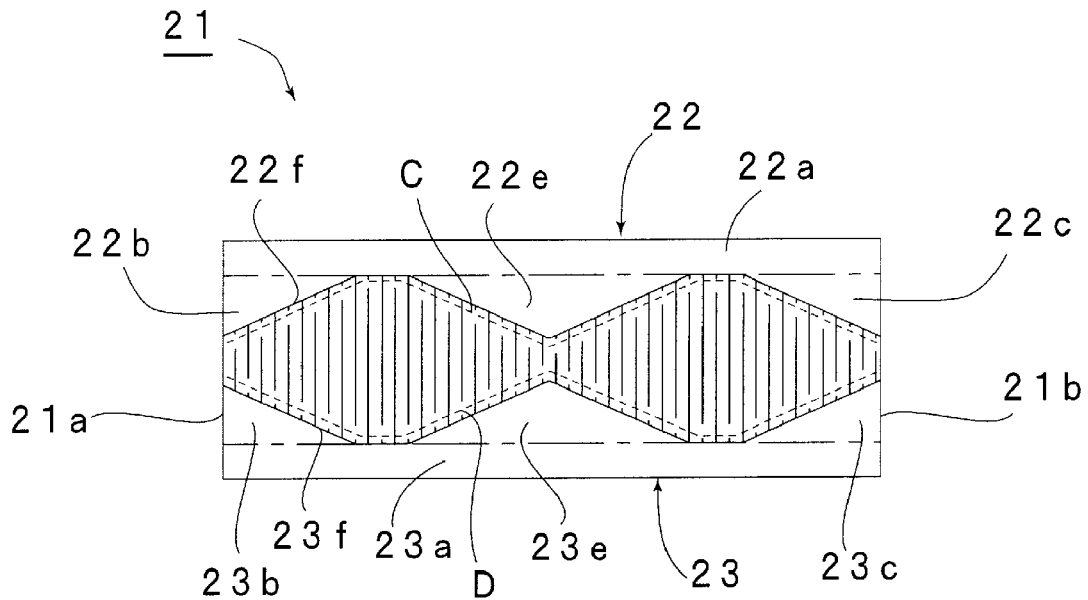
FIG. 2 is a schematic plan view illustrating the electrode structure of an IDT electrode of a surface acoustic wave resonator included in a series-arm resonator of the ladder filter.

The electrode structure of the IDT electrode of the series-arm resonator S1 is illustrated in FIG. 2. An IDT electrode 21 that defines the series-arm resonator S1 is preferably formed in the same way as the IDT electrode 7 illustrated in FIG. 1B except for the fact that the structures of the common electrodes are different.

Namely, here, a first common electrode 22 and a second common electrode 23, in addition to including common electrode extension portions 22b, 22c, 23b and 23c provided in the vicinities of a first end 21a and a second end 21b, also include common electrode extension portions 22e and 23e in a central region in the surface acoustic wave propagation direction.

In addition, the inner edge of a common electrode body 22a is parallel to the surface acoustic wave propagation direction in first and second maximum-crossing-width portions between the common electrode extension portion 22e and the common electrode extension portion 22b and between the common electrode extension portion 22e and the common electrode extension portion 22c. An inner edge 22f of the common electrode extension portion 22e is parallel to an envelope C. Namely, the inner edge 22f crosses the surface acoustic wave propagation direction so as to approach the side of the second common electrode 23 while extending from a maximum-crossing-width portion toward a central portion having a minimum crossing width. In addition, the inner edge 22f of the common electrode extension portion 22e moves away from the second common electrode 23 and is not parallel with the surface acoustic wave propagation direction, while extending from a minimum-crossing-width portion toward a second maximum-crossing-width portion.

The second common electrode 23, in addition to including the common electrode extension portions 23b and 23c, similarly also includes the common electrode extension portion 23e. In other respects, the IDT electrode 21 is preferably formed in the same way as the IDT electrode 7 and therefore corresponding portions are denoted by corresponding reference numbers and description thereof is omitted.

Therefore, the IDT electrode 21, which defines the series-arm resonator S1, also includes first and second diamond-shaped weighted portions, that is, includes a structure in which diamond-shaped weighting is provided with a period of two.

Figure 4:
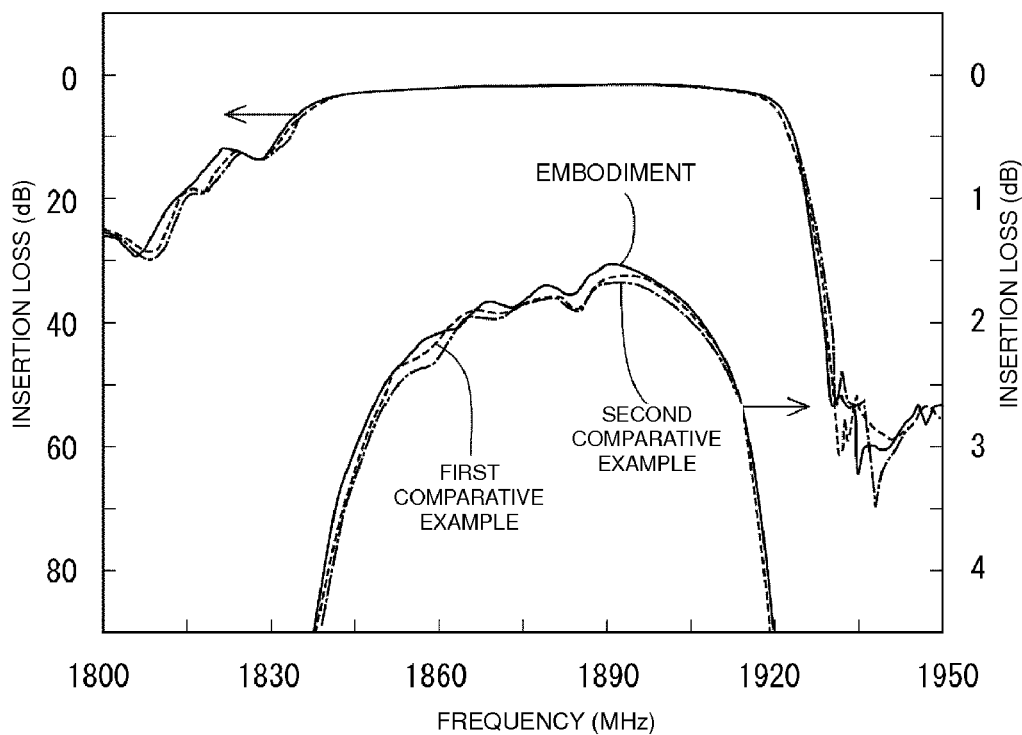
FIG. 4 is a plot illustrating attenuation vs. frequency characteristics for the ladder filter of a preferred embodiment of the present invention and for ladder filters of first and second comparative examples.

The attenuation frequency characteristics of the ladder filter of this preferred embodiment are illustrated with a solid line in FIG. 4. Furthermore, a first comparative example ladder filter was manufactured to be the same as the ladder filter of the first preferred embodiment except that the IDT electrodes of the parallel-arm resonators P1 to P3 were preferably formed to be the same as the IDT electrodes of the series-arm resonators S1 to S3 by using the same structure as that of the IDT electrode 21 illustrated in FIG. 2.

Furthermore, a second comparative example ladder filter was also manufactured preferably to be the same as the ladder filter of the present preferred embodiment except that, in contrast to that of the present preferred embodiment, the IDT electrodes of the series-arm resonators S1 to S3 were made to be the same as the IDT electrode 7 illustrated in FIG. 1B and the IDT electrodes of the parallel-arm resonators P1 to P3 were made to be the same as the IDT electrode 21 illustrated in FIG. 2.

The attenuation frequency characteristics of the ladder filters of the first and second comparative examples are illustrated using a dashed line and an alternate long and short dash line in FIG. 4, respectively.

As is clear from FIG. 4, in the present preferred embodiment, it can be understood that the maximum insertion loss in the transmission-side pass band, which is Band 2 from about 1850 MHz to about 1910 MHz, is very small at about 2.53 dB, for example. In contrast, in the first comparative example, the maximum insertion loss in the pass band was about 2.62 dB and in the second comparative example was about 2.70 dB, for example. Therefore, according to the present preferred embodiment, it can be understood that the insertion loss in the pass band can be made very small compared with in the first and second comparative examples. The reason for this will be explained below.

Figure 3:
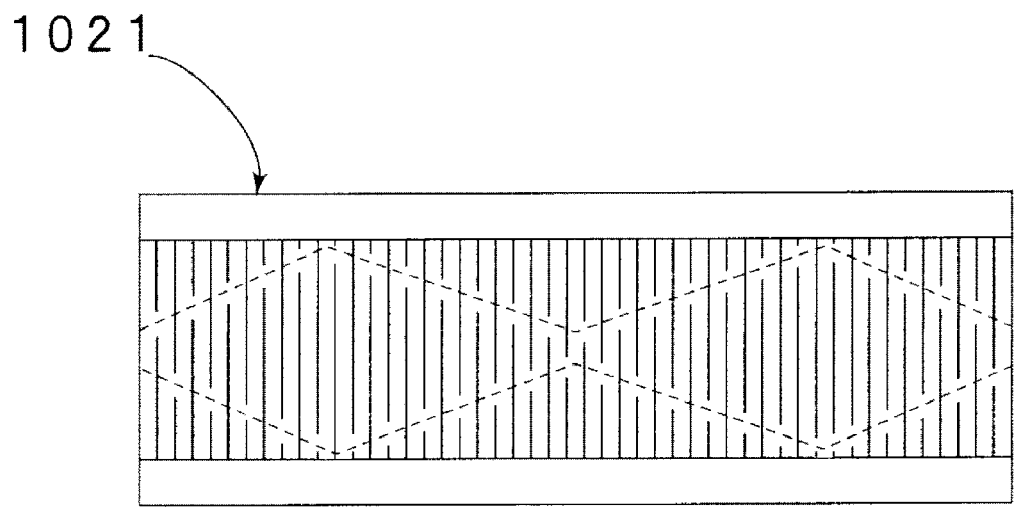
FIG. 3 is a schematic plan view illustrating the electrode structure of an existing IDT electrode prepared for comparison.
Figure 5:
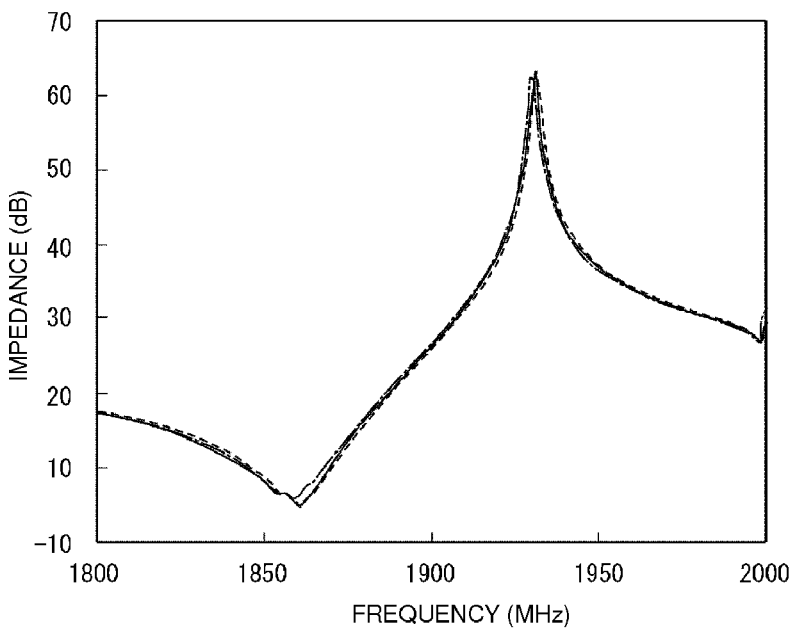
FIG. 5 is a plot illustrating impedance characteristics for the surface acoustic wave resonator according to a preferred embodiment of the present invention and for the surface acoustic wave resonators of the comparative examples.
Figure 6:
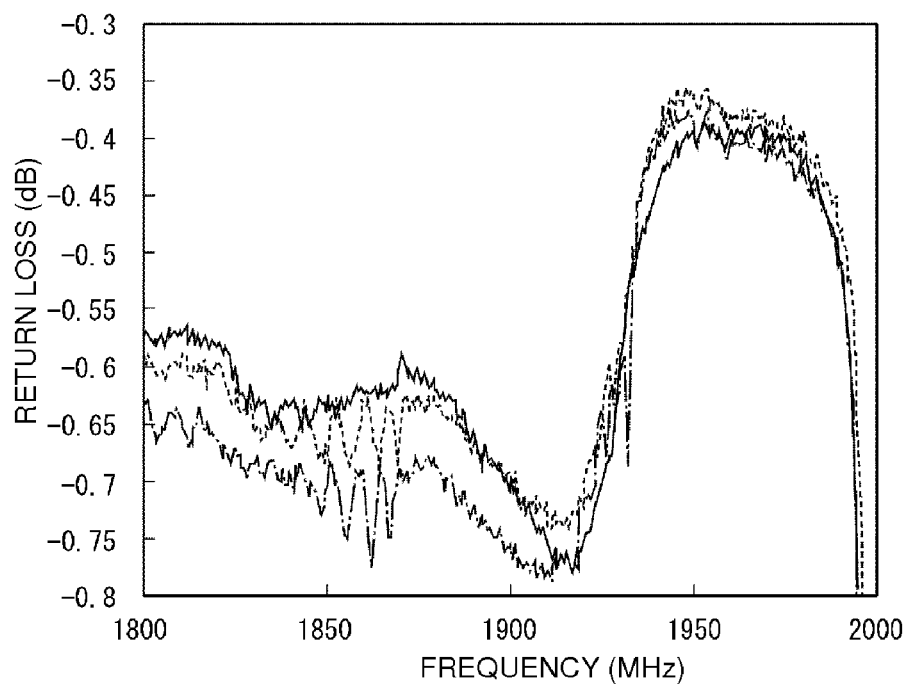
FIG. 6 is a plot illustrating return loss characteristics for the surface acoustic wave resonator according to a preferred embodiment of the present invention and for the surface acoustic wave resonators of the comparative examples.

The following were prepared: a surface acoustic wave resonator including the IDT electrode 7 illustrated in FIG. 1B; a surface acoustic wave resonator including the IDT electrode 21 illustrated in FIG. 2; and a surface acoustic wave resonator including an IDT electrode 1021 of the background art to which diamond-shaped weighting had been applied with a period of two but that did not have common electrode extension portions as illustrated in FIG. 3. FIG. 5 illustrates the impedance characteristics of the three types of surface acoustic wave resonators and FIG. 6 illustrates the return loss characteristics thereof. In FIG. 5 and FIG. 6, a solid line represents the characteristics for the IDT electrode 21, a dashed line represents the characteristics for the IDT electrode and the alternate long and short dash line represents the characteristics for the IDT electrode 1021.

As is clear from FIG. 6, in the vicinity of 1870 MHz, which is the resonant frequency, the return loss is smaller when the IDT electrode 7 is used than when the IDT electrode 1021 is used, and the return loss can be made even smaller when the IDT electrode 21 is used. In the vicinity of the anti-resonant frequency, particularly in the vicinity of about 1940 MHz to about 1950 MHz, the return loss is smaller when the IDT electrode 1021 is used than when the IDT electrode 21 is used and the return loss can be minimized when the IDT electrode 7 is used.

At the resonant frequency, the return loss is strongly dependent on the electrical resistance of the electrode fingers. Therefore, it is thought that it is possible to maximize the metallization ratio of the non-crossing regions so as to minimize the return loss in the IDT electrode 21. At the anti-resonant frequency, the return loss is strongly dependent on the excitation intensity of the surface acoustic wave. Therefore, in the IDT electrode 21, it is thought that since obstructing of propagation of a surface acoustic wave in the central portion in the surface acoustic wave propagation direction is proportional to how many common electrode extension portions 22e and 23e there are in the non-crossing regions, the excitation intensity is weak and the return loss is large.

In contrast, in the IDT electrodes 7 and 1021, it is thought that since there are no common electrode extension portions in the central portion of the IDT electrode in the surface acoustic wave propagation direction and propagation of a surface acoustic wave is not readily obstructed, the return loss at the anti-resonant frequency is small. Furthermore, in the IDT electrode 7, since the common electrode extension portions 12b, 12c, 13b and 13c are provided in the vicinities of the first and second ends 7a and 7b, the resistive loss of dummy electrodes is reduced and a current flows more easily than in the case where the IDT electrode 1021 is used. Consequently, it is thought that the effect of strengthening the excitation intensity of a surface acoustic wave and the return loss are even more reduced at the anti-resonant frequency.

In a ladder filter, in order to reduce the insertion loss in the pass band, it is preferable that the return loss in the vicinity of the resonant frequency of a series-arm resonator be small and that the return loss in the vicinity of the anti-resonant frequency in a parallel-arm resonator be small. From the above, the return loss in the vicinity of the resonant frequency is smallest when the IDT electrode 21 is used and the return loss in the vicinity of the anti-resonant frequency is smallest when the IDT electrode 7 is used.

Therefore, as in this preferred embodiment, it is clear that the insertion loss within the pass band can be made very small by providing the series-arm resonators to include the IDT electrode 21 and providing the parallel-arm resonators to include the IDT electrode 7.

Furthermore, in the ladder filter 1 of this preferred embodiment, since apodization weighting is applied to both the series-arm resonators S1 to S3 and the parallel-arm resonators P1 to P3 such that diamond-shaped weighting is provided with a period of two, the electric power handling capability is also increased. It is not necessarily required that the weighting be limited to a period of two in the present invention, and the weighting may be provided with a period of three or more.

Thus, the ladder filter 1 of this preferred embodiment has a small insertion loss and a high electric power handling capability and therefore is particularly suitable for use as a transmission-side band-pass filter in a duplexer of a mobile telephone.

Furthermore, the present invention is not limited to the ladder filter 1 of the above-described preferred embodiment and an elastic wave resonator having the IDT electrode 7 or the IDT electrode 21 is also provided as an elastic wave resonator according to a preferred embodiment of the present invention as a standalone unit. Compared with the existing elastic wave resonator described in PCT International Publication No. WO 2007/108269, an elastic wave resonator including the IDT electrode 21 has a greater return loss in the vicinity of the anti-resonant frequency but has a smaller return loss in the vicinity of the resonant frequency. Furthermore, compared with the elastic wave resonator described in PCT International Publication No. WO 2007/108269, an elastic wave resonator including the IDT electrode 7 has a smaller return loss both in the vicinity of the anti-resonant frequency and in the vicinity of the resonant frequency. Thus, the elastic resonator according to a preferred embodiment of the present invention, despite being just a simple resonator, achieves an effect of being more excellent than existing elastic wave resonators and therefore can also be used in applications other than band-pass filters.

In addition, provided that the metallization ratios of the non-crossing regions in the vicinities of the first end 7a and the second end 7b can be made relatively high, the return loss in the vicinity of the anti-resonant frequency can be improved, similarly to the surface acoustic wave resonator according to a preferred embodiment of the present invention. A structure in which the metallization ratio is made high in portions thereof in order to improve the return loss in this way is not limited to one provided with the common electrode extension portions 12b, 12c, 13b and 13c.

Figure 7:
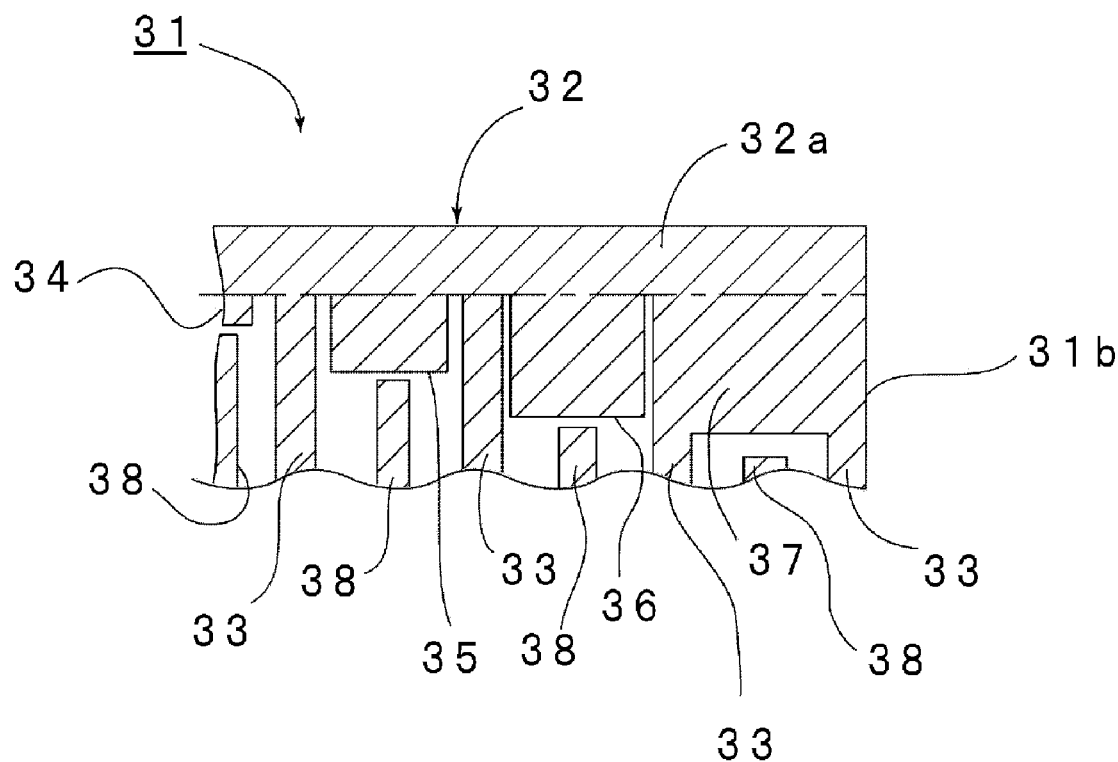
FIG. 7 is a schematic partial enlarged plan view for explaining the electrode structure of a modified example of an elastic wave resonator according to a preferred embodiment of the present invention.

A modified example of the structure of the IDT electrode 7 in which the metallization ratio is increased is illustrated in FIG. 7. FIG. 7 is a schematic plan view illustrating the vicinity of a second end 31b of an IDT electrode 31 of the modified example in the surface acoustic wave propagation direction in an enlarged manner.

In the vicinity of the second end 31b of the IDT electrode 31, a plurality of first electrode fingers 33 and a plurality of second dummy electrode fingers 34 to 37 are connected to a common electrode body 32a of a first common electrode 32. In addition, the plurality of first electrode fingers 33 are interposed between a plurality of second electrode fingers 38 and here leading-end portions of the first electrode fingers 33 and a base-end portion of the second dummy electrode finger 34 have been cut away.

Also in this modified example, the common electrode body 32a preferably has a stripe-shaped configuration that extends parallel to the surface acoustic wave propagation direction. Here, the common electrode extension portion 12c illustrated in FIG. 1B is not provided and in the plurality of second dummy electrode fingers 34 to 37, the widths of the second dummy electrode fingers 34 to 37 sequentially become larger toward a second end 32b side and the longer the dummy electrode fingers are, the wider they are. More specifically, moving from the second dummy electrode finger 34 toward the second dummy electrode finger 37, the width of the electrode fingers increases.

Therefore, the metallization ratio of a non-crossing region in the vicinity of the second end 31b is higher than the metallization ratio of a non-crossing region further toward the inside in the surface acoustic wave propagation direction.

In this way, a structure in which the metallization ratio of non-crossing regions at the two ends is higher than the metallization ratio of a non-crossing region on the inside in the surface acoustic wave propagation direction, can be modified in various ways. In addition, in the IDT electrode 31, the width of the relatively longer second dummy electrode finger 37 is larger than those of the relatively shorter second dummy electrode fingers 34 and 35, but the width of the long second dummy electrode finger 37 may be the same as that of the second dummy electrode finger 34 or the second dummy electrode finger 35. Also in this case, in a portion in which the long second dummy electrode finger 37 is provided, the metallization ratio of the non-crossing region can be made higher in proportion to the long length.

In this way, the metallization ratio may be increased by making the widths of the second dummy electrode fingers 34 to 37 larger.

In addition, the first electrode fingers 33 and 33 are continuous with the dummy electrode finger portion in the second dummy electrode finger 37, and this is equivalent to the base ends of first electrode fingers 33 and 33 and the second dummy electrode finger 37 arranged therebetween being integrated with one another. In this way, the dummy electrode fingers may be electrically connected to the first electrode fingers, which are connected to a common potential.

Only the second end 31b side of the IDT electrode 31 is illustrated but the metallization ratio is relatively increased in the same way on the first end side thereof. Furthermore, not only on the first common electrode 32 side, but also on a second common electrode side on a side opposite thereto, the metallization ratio is relatively increased in the same way at both ends in the surface acoustic wave propagation direction. Therefore, the return loss can also be effectively improved in the vicinity of the anti-resonant frequency in the IDT electrode 31.

In addition, in the above-described preferred embodiment and each modified example, a ladder filter including surface acoustic wave resonators and a surface acoustic wave resonator have been described, but a boundary acoustic wave resonator including boundary acoustic waves rather than surface acoustic waves may be used instead in other preferred embodiments of the present invention.

Figure 8:
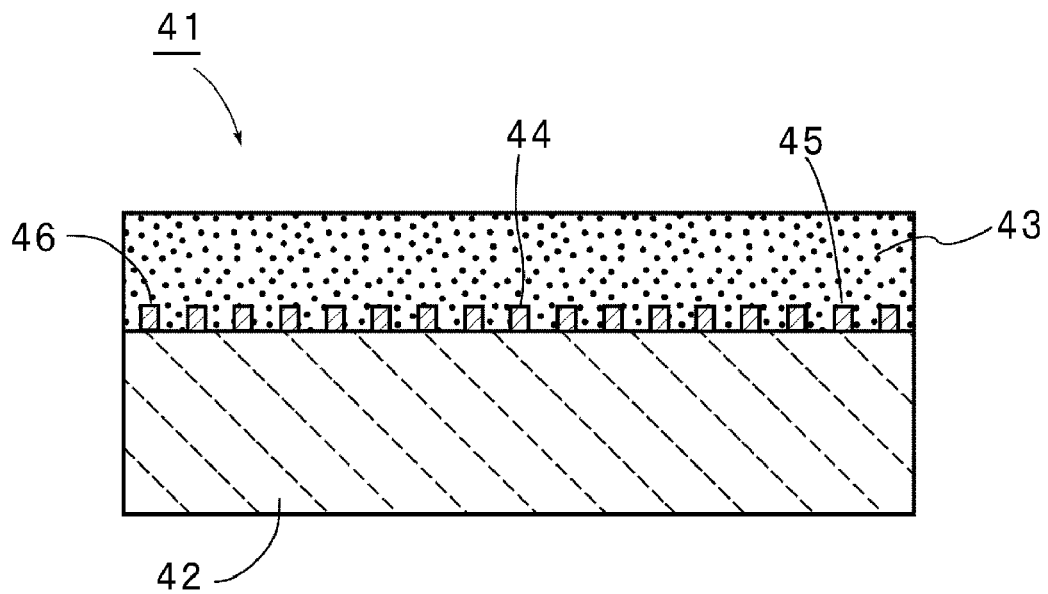
FIG. 8 is a schematic front sectional view for explaining a boundary acoustic wave resonator to which a preferred embodiment of the present invention has been applied.
Figure 9:
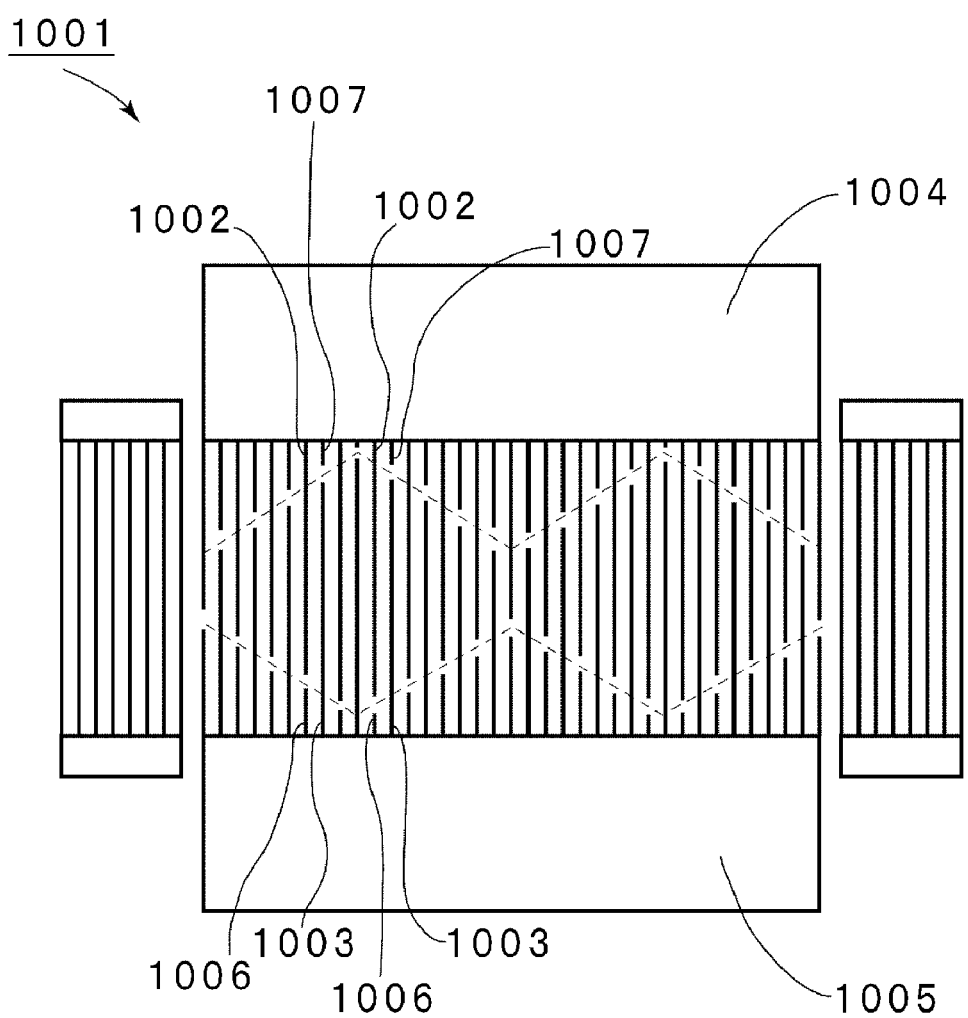
FIG. 9 is a plan view for explaining an existing elastic wave resonator.

As illustrated in FIG. 8, a boundary acoustic wave resonator 41 includes a piezoelectric substrate 42 and a dielectric layer 43 located on the piezoelectric substrate 42. An IDT electrode 44 and reflectors 45 and 46 are located on the boundary plane between the piezoelectric substrate 42 and the dielectric layer 43. By exciting the IDT electrode 44, characteristics of resonance due to boundary acoustic waves propagating along the boundary plane can be utilized. As described above, an elastic wave resonator according to a preferred embodiment of the present invention is characterized by the electrode structure of the IDT electrode thereof and therefore preferred embodiments of the present invention can be applied not only to surface acoustic wave resonators but also to this type of boundary acoustic wave resonator 41. Furthermore, a ladder filter according to a preferred embodiment of the present invention may be provided to include this type of boundary acoustic wave resonator 41.

Furthermore, in the region in which the common electrode extension portions of the IDT electrode are provided, the width of the common electrode becomes substantially wider and therefore the outer side of the common electrode may be trimmed so that the space between the common electrode or the inner edge of the common electrode and the outer edge of the common electrode becomes constant. Specifically, in a region in which a common electrode extension portion is provided, the outer edge of the common electrode is preferably parallel to the apodization weighting envelope.

Furthermore, in the above-described preferred embodiment and each modified example, diamond-shaped weighting having a plurality of periods is preferably provided, but the apodization weighting may be circular or elliptical weighting, for example. Furthermore, one of the pair of envelopes may be non-parallel with the elastic wave propagation direction while the other may be parallel with the elastic wave propagation direction. In other words, in the apodization weighting in various preferred embodiments of the present invention, preferably there are at least two points of change within the IDT electrode at which the change in crossing width changes from increasing to decreasing and it is not necessarily required that the crossing widths at the individual points of change be the same.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave resonator comprising:
    a piezoelectric substrate; and
    an IDT electrode located on the piezoelectric substrate; wherein
    the IDT electrode includes:
        first and second common electrodes arranged so as to be separated from each other on the piezoelectric substrate;
        a plurality of first electrode fingers each including a first end connected to the first common electrode and a second end extending toward the second common electrode;
        a plurality of second electrode fingers each including a first end connected to the second common electrode and a second end thereof extending toward the first common electrode;
        a plurality of first dummy electrode fingers each including a first end connected to the second common electrode, and a second end extending toward the first common electrode and being arranged with a gap interposed between itself and the second end of one of the plurality of first electrode fingers;
        a plurality of second dummy electrode fingers each including a first end being connected to the first common electrode, and a second end extending toward the second common electrode and being arranged with a gap interposed between itself and the second end of one of the plurality of second electrode fingers; wherein
    a crossing region is defined by a portion in which the first and second electrode fingers overlap one another in an elastic wave propagation direction, and a portion in which the first and second dummy electrode fingers are located is a non-crossing region;
    the IDT electrode is apodization weighted so that a crossing width of the first and second electrode fingers changes in the elastic wave propagation direction, there being at least two points of change in the apodization weighting at which the crossing width changes from increasing to decreasing; and a metallization ratio that is a ratio of an area of electrode portions including the first and second electrode fingers or the first and second dummy electrode fingers to an entire area of a region in which the electrode portions are provided, is relatively high in at least a portion of the non-crossing region compared with that in the crossing region; and compared with a metallization ratio of a non-crossing region located between the at least two points of change, a metallization ratio of a non-crossing region located between a first end of the IDT electrode in the elastic wave propagation direction and a point of change closest to a side of the first end of the IDT electrode, and a metallization ratio of a non-crossing region located between a second end of the IDT electrode in the elastic wave propagation direction and the point of change closest to a side of the second end, are relatively high.

2. The elastic wave resonator according to claim 1, wherein the metallization ratios of all of the non-crossing regions are relatively high compared with the metallization ratio of the crossing region.

3. The elastic wave resonator according to claim 1, wherein, in the non-crossing regions, the metallization ratios are high due to there being common electrode extension portions that extend from the first and second common electrodes toward the crossing region side.

4. The elastic wave resonator according to claim 3, wherein inner edges of the first and second common electrodes extend in parallel with the elastic wave propagation direction and inner edges of the common electrode extension portions extend in a direction that crosses the elastic wave propagation direction.

5. The elastic resonator according to claim 1, wherein widths of the first and second dummy electrode fingers in the non-crossing regions are larger than widths of the first and second electrode fingers in the crossing region and as a result, metallization ratios of the non-crossing regions are high.

6. The elastic wave resonator according to claim 5, wherein, among the first and second dummy electrode fingers, the widths of dummy electrode fingers that are relatively long are larger than the widths of dummy electrode fingers that are relatively short.

7. The elastic wave resonator according to claim 2, wherein the elastic wave is a surface acoustic wave and the elastic wave resonator is a surface acoustic wave resonator.

8. The elastic wave resonator according to claim 2, wherein the elastic wave is a boundary acoustic wave and the elastic wave resonator is a boundary acoustic wave resonator.

9. A ladder filter comprising:
a series-arm resonator and a parallel-arm resonator; wherein
each of the series-arm resonator and the parallel-arm resonator comprises:
a piezoelectric substrate; and
an IDT electrode located on the piezoelectric substrate; wherein
the IDT electrode includes:
first and second common electrodes arranged so as to be separated from each other on the piezoelectric substrate;
a plurality of first electrode fingers each including a first end connected to the first common electrode and a second end extending toward the second common electrode;
a plurality of second electrode fingers each including a first end connected to the second common electrode and a second end thereof extending toward the first common electrode;
a plurality of first dummy electrode fingers each including a first end connected to the second common electrode, and a second end extending toward the first common electrode and being arranged with a gap interposed between itself and the second end of one of the plurality of first electrode fingers;
a plurality of second dummy electrode fingers each including a first end being connected to the first common electrode, and a second end extending toward the second common electrode and being arranged with a gap interposed between itself and the second end of one of the plurality of second electrode fingers; wherein
a crossing region is defined by a portion in which the first and second electrode fingers overlap one another in an elastic wave propagation direction, and a portion in which the first and second dummy electrode fingers are located is a non-crossing region;
the IDT electrode is apodization weighted so that a crossing width of the first and second electrode fingers changes in the elastic wave propagation direction, there being at least two points of change in the apodization weighting at which the crossing width changes from increasing to decreasing; and
a metallization ratio that is a ratio of an area of electrode portions including the first and second electrode fingers or the first and second dummy electrode fingers to an entire area of a region in which the electrode portions are provided, is relatively high in at least a portion of the non-crossing region compared with that in the crossing region;
in the parallel-arm resonator, compared with a metallization ratio of a non-crossing region located between the at least two points of change, a metallization ratio of a non-crossing region located between a first end of the IDT electrode in the elastic wave propagation direction and a point of change closest to a side of the first end of the IDT electrode, and a metallization ratio of a non-crossing region located between a second end of the IDT electrode in the elastic wave propagation direction and the point of change closest to a side of the second end, are relatively high; and
in the series-arm resonator, the metallization ratios of all of the non-crossing regions are relatively high compared with the metallization ratio of the crossing region.

10. A duplexer comprising:
a transmission-side band-pass filter and a reception-side band-pass filter; wherein
the transmission-side band-pass filter is defined by the ladder filter according to claim 9.

* * * * *